(12) United States Patent
Liu et al.

(10) Patent No.: US 8,430,152 B2
(45) Date of Patent: Apr. 30, 2013

(54) HEAT DISSIPATION DEVICE

(75) Inventors: Heng Liu, Shenzhen (CN); Jing Zhang, Shenzhen (CN)

(73) Assignees: Fu Zhun Precision Industry (Shen Zhen) Co., Ltd., Shenzhen (CN); Foxconn Technology Co., Ltd., New Taipei (TW)

( * ) Notice: Subject to any disclaimer, the term of this patent is extended or adjusted under 35 U.S.C. 154(b) by 531 days.

(21) Appl. No.: 12/760,562

(22) Filed: Apr. 15, 2010

(65) Prior Publication Data

US 2011/0108236 A1    May 12, 2011

(30) Foreign Application Priority Data

Nov. 9, 2009 (CN) .......................... 2009 1 0309454

(51) Int. Cl.
*H01L 23/467* (2006.01)
*H05K 7/20* (2006.01)

(52) U.S. Cl.
USPC ........................................... 165/68; 165/80.3

(58) Field of Classification Search .................. 165/67, 165/68, 76, 80.2, 80.3, 185; 361/697, 702, 361/703, 704, 709
See application file for complete search history.

(56) References Cited

U.S. PATENT DOCUMENTS

| 7,038,913 | B2 * | 5/2006 | Lee et al. ....................... 361/709 |
| 7,281,893 | B2 * | 10/2007 | Pan ................................ 415/177 |
| 7,495,921 | B2 * | 2/2009 | Chang et al. ................... 361/719 |
| 7,532,472 | B2 * | 5/2009 | Lin et al. ....................... 361/697 |
| 7,583,503 | B2 * | 9/2009 | Lin ................................ 361/704 |
| 2009/0073656 | A1 * | 3/2009 | Otsuki et al. .................. 361/697 |
| 2010/0243219 | A1 * | 9/2010 | Yang ............................. 165/122 |
| 2011/0030919 | A1 * | 2/2011 | Chu ................................ 165/67 |

\* cited by examiner

*Primary Examiner* — Tho V Duong
(74) *Attorney, Agent, or Firm* — Altis Law Group, Inc.

(57) ABSTRACT

An exemplary heat dissipation device includes a round heat sink and a fixing frame. The heat sink defines receiving depressions at an outer peripheral surface thereof. The fixing frame includes a peripheral side plate disposed around the heat sink and fixing legs corresponding to the receiving depressions of the heat sink extending downwardly from the side plate. The fixing frame includes blocks extending inwardly from an inner surface of the side plate and protruding members extending inwardly from the fixing legs. The heat sink is rotatably received in the fixing frame with a top of the heat sink abutting the blocks. When the heat sink is in an unlocked state, the protruding members align with the receiving depressions, respectively. When the heat sink is rotated to a locked state, the protruding members abut a bottom of the heat sink.

15 Claims, 7 Drawing Sheets

HEAT DISSIPATION DEVICE

BACKGROUND

1. Technical Field

The present disclosure relates to heat dissipation devices, and particularly to a heat dissipation device having a heat sink rotatably received in a fixing frame.

2. Description of Related Art

Heat dissipation devices are commonly used for cooling electronic components such as central processing units (CPUs).

Generally, a heat dissipation device includes a heat sink and a fastener for mounting the heat sink to an electronic component seated on a print circuit board. The fastener comprises a pin and a spring disposed around the pin. The pin has a head at an end thereof and a clamping portion at an opposite end thereof. The clamping portion has an anchor-shaped cross-section, and comprises a pair of hooks extending upwardly and outwardly from a bottom thereof towards two opposite sides thereof. A tab extends upwardly from an inner side of each hook. The pin of the fastener passes through the heat sink and the printed circuit board. The spring is compressed between the head of the pin and the heat sink to provide a spring force impelling the hooks of the clamping portion to clamp a bottom face of the printed circuit board, thereby attaching the heat sink to the electronic component.

Before the fastener is applied to the heat sink, the spring and the pin are separate from each other. The spring must be manually coiled around the pin of the fastener before the fastener is applied to the heat sink, a time-consuming and inconvenient operation.

It is thus desirable to provide a heat dissipation device which can overcome the described limitations.

DETAILED DESCRIPTION

Figure 1:
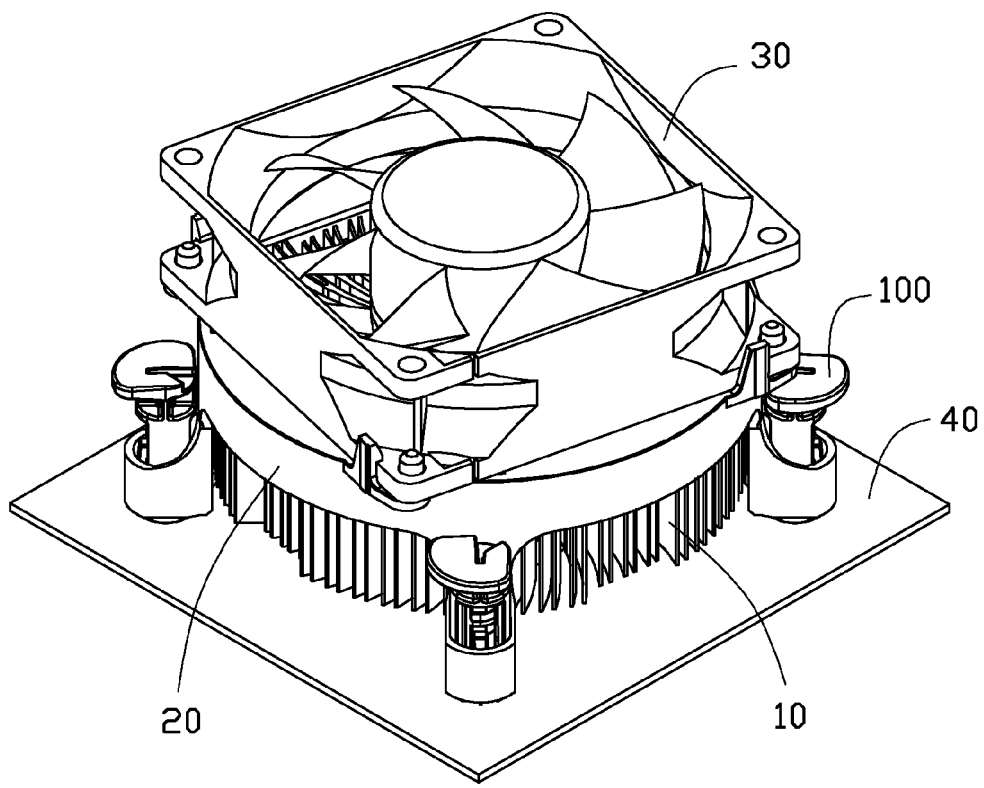
FIG. 1 is an assembled view of a heat dissipation device according to an exemplary embodiment of the present disclosure.

Reference will now be made to the drawing figures to describe various embodiments of the present heat dissipation device in detail.

Figure 2:
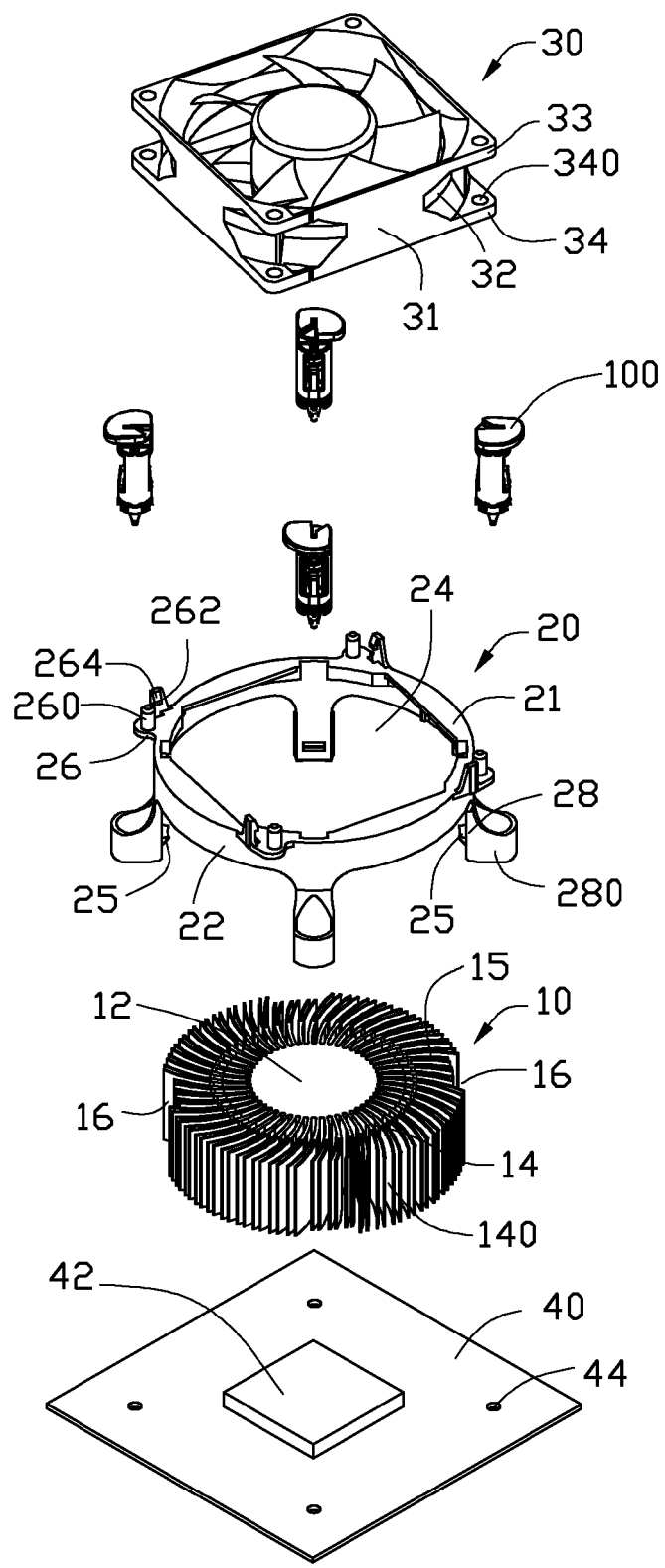
FIG. 2 is an exploded view of the heat dissipation device of FIG. 1.

Referring to FIGS. 1 and 2, a heat dissipation device according to an exemplary embodiment is disclosed. In this embodiment, the heat dissipation device is applied for dissipating heat generated by an electronic component 42 mounted on a printed circuit board 40. The heat dissipation device comprises a heat sink 10 attached to the electronic component 42, a fan 30, and a fixing frame 20. The fan 30 is mounted to the heat sink 10 via the fixing frame 20.

Figure 4:
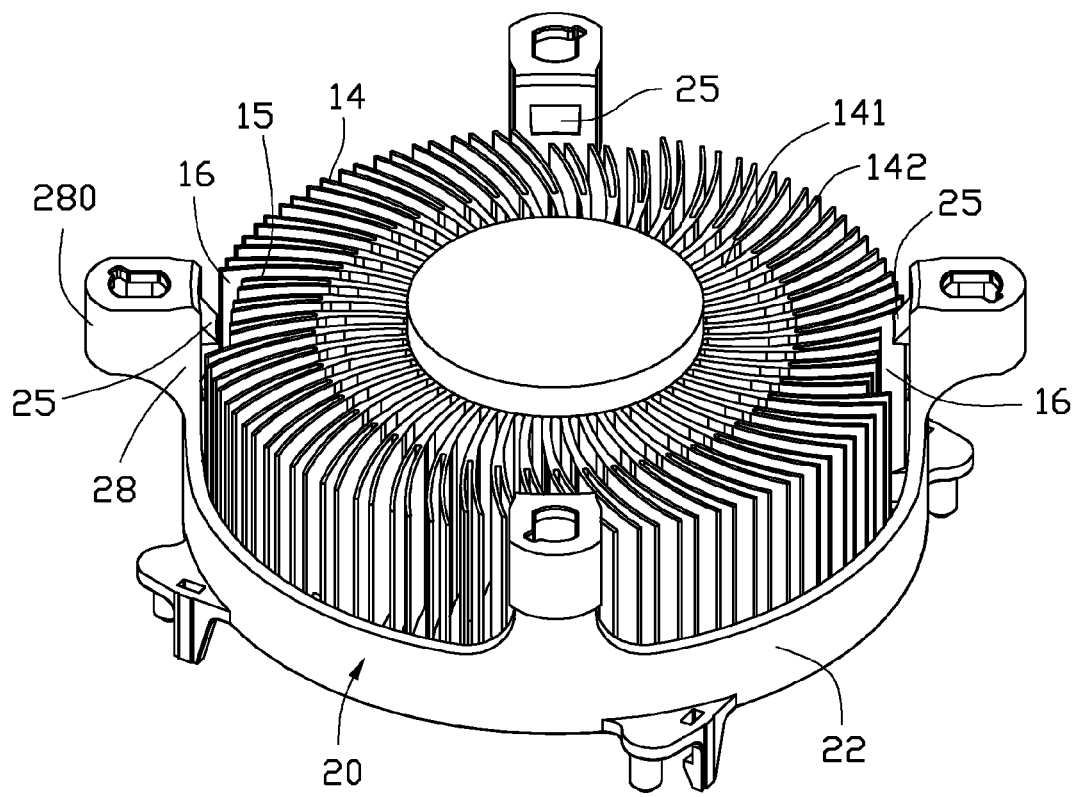
FIG. 4 is similar to FIG. 3, but showing a heat sink of the heat dissipation device attached to the fixing frame, wherein the heat sink and the fixing frame are in an unlocked position.

The heat sink 10 is substantially cylindrical. The heat sink 10 can be made of a metallic material having some resiliency and good heat conductivity, such as aluminum, copper and etc. The heat sink 10 comprises a cylindrical core 12, and four sets of first fins 14 and four sets of second fins 15 extending outwardly and generally radially from an outer surface of the cylindrical core 12. The sets of first fins 14 and the sets of second fins 15 are alternately arranged along a circumferential direction of the cylindrical core 12. Each of the first fins 14 is wider than each of the second fins 15, as measured along a substantially radial direction of the heat sink 10. Each of the first and second fins 14, 15 includes an inner portion 141 connected to the outer surface of the cylindrical core 12, and two branches 142 (see esp. FIG. 4) extending outwards from the inner portion 141. A slit 140 is defined between the two branches 142. In this embodiment, the first and second fins 14, 15 are fabricated by extrusion.

The first and second fins 14, 15 are all curved, and are all oriented along substantially the same direction relative to radial directions of the heat sink 10. With this configuration, a surface area of the heat sink 10 is increased. In this embodiment, the first and second fins 14, 15 are curved outwards in a generally clockwise direction as viewed from a top of the heat sink 10 in FIG. 1. Since the first fins 14 are longer than the second fins 15, a receiving depression 16 is defined at outer ends of each set of the second fins 15. That is, each receiving depression 16 is located between two corresponding neighboring sets of the first fins 14. Thus, four receiving depressions 16 corresponding to the four sets of the second fins 15 are defined between the sets of first fins 14. The receiving depressions 16 are equally spaced from each other.

The fan 30 includes a housing 31. The housing 31 includes an annular sidewall 32, and a top wall 33 and a bottom wall 34 extending outwardly from top and bottom ends of the sidewall 32, respectively. Each of the top and the bottom walls 33, 34 has a rectangular outline. Four through holes 340 are defined in four corners of the bottom wall 34, respectively.

The fixing frame 20 is typically made of plastic material, and formed by an integral molding method. Alternatively, the fixing frame 20 can be made of a metallic material having high rigidity. The fixing frame 20 includes a circular top plate 21 defining a square hole 24 at a center thereof, an annular side plate 22 extending downwardly and perpendicularly from an outer periphery of the top plate 21, and a plurality of fixing legs 28 extending downwardly from a bottom of the side plate 22. Four ears 26 equally spaced from each other extend outwardly from the outer periphery of the top plate 21. Each ear 26 is substantially triangular. A mounting post 260 and a fastening arm 262 extend upward and perpendicularly from a top surface of each of the ears 26, respectively. The mounting posts 260 correspond to the through holes 340 of the housing 31, respectively. Each of the fastening arms 262 includes a hook 264 extending inwardly from a top end thereof.

Figure 3:
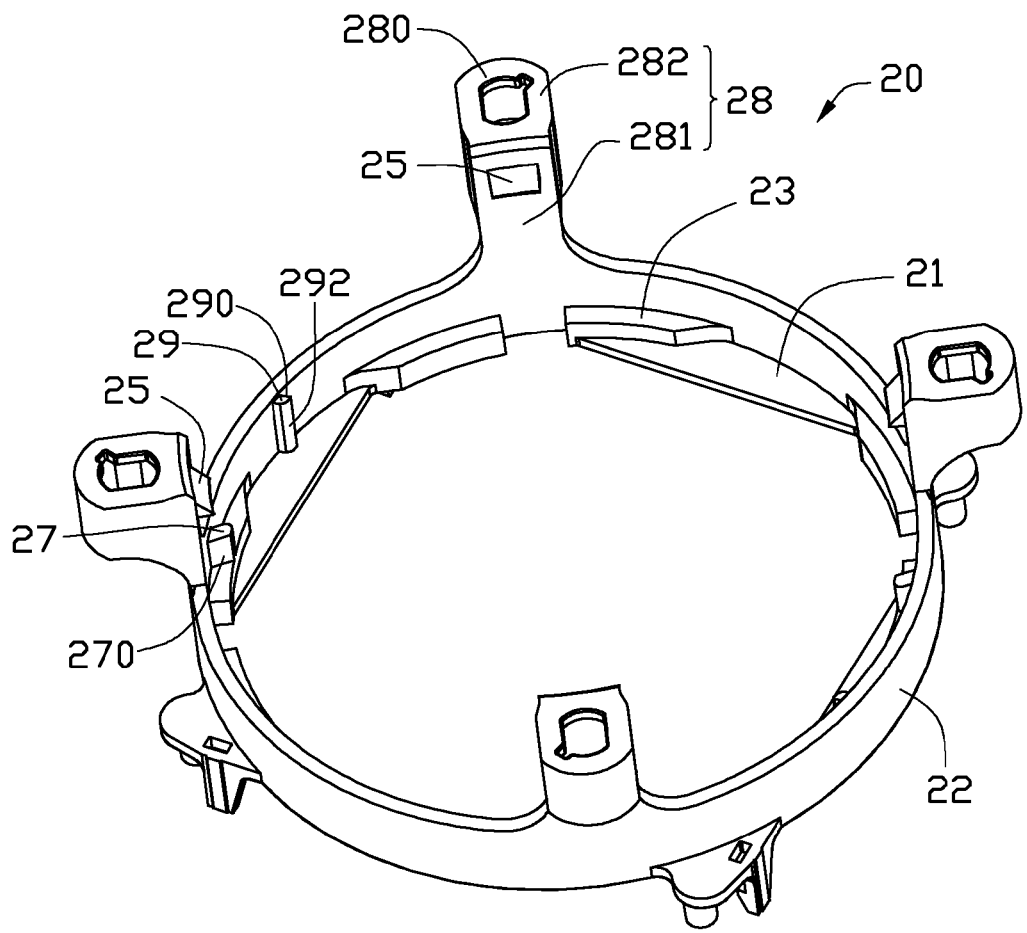
FIG. 3 is an isometric view of a fixing frame of the heat dissipation device of FIG. 2, showing the fixing frame inverted.

The number of fixing legs 28 is equal to the number of receiving depressions 16 of the heat sink 10. Referring to FIG. 3, each of the fixing legs 28 includes a vertical wall 281 extending downwardly from the bottom of the side plate 22, and a horizontal wall 282 extending outwardly and perpendicularly from a bottom end of the vertical wall 281. The vertical wall 281 includes an inner surface and an outer surface. The inner surfaces of the vertical walls 281 and an inner surface of the side plate 22 are arranged along the same imaginary cylindrical surface. A protruding member 25 extends inwardly from the inner surface of the vertical wall 281 towards a center of the side plate 22. Each horizontal wall 282 defines a hole 280 therein.

A plurality of blocks 23 protrude inwardly from a top portion of the inner surface of the side plate 22. Each block 23 is located adjacent to the top plate 21, and is taller than the top plate 21 as measured parallel to a central axis of the side plate 22. A distance between the protruding members 25 and the blocks 23 is substantially equal to the height of the heat sink 10. A first rib 29 and a second rib 27 protrude inwardly from the inner surface of the side plate 22. The first rib 29 is centered between two neighboring fixing legs 28. The second rib 27 is located between the same two neighboring fixing legs 28 as the first rib 29, and is adjacent to the one of the two neighboring fixing legs 28. Each of the first and second ribs 29, 27 extends parallel to the axis of the side plate 22, and is perpendicular to the top plate 21. Each of the first and second ribs 29, 27 is narrower than the distance between each two neighboring fins 14, 15 of the heat sink 10.

The first rib 29 includes a planar stopping surface 290 and a curved guide surface 292. The stopping surface 290 is substantially perpendicular to the inner surface of the side plate 22, and located at a lateral side of the first rib 29 farthest away from the corresponding second rib 27. A direction from the guide surface 292 to the stopping surface 290 of the first rib 29 is opposite to the general direction of curvature of the fins 14, 15. The second rib 27 includes a planar limitation surface 270 at a lateral side thereof farthest away from the corresponding first rib 29. The limitation surface 270 is substantially perpendicular to the inner surface of the side plate 22. Alternatively, the number of first and second ribs 29, 27 can be varied. For example, another one or more pairs of first and second ribs 29, 27 can be formed in the inner surface of the side plate 22. Each such pair of first and second ribs 29, 27 can be located between two other neighboring fixing legs 28.

Figure 5:
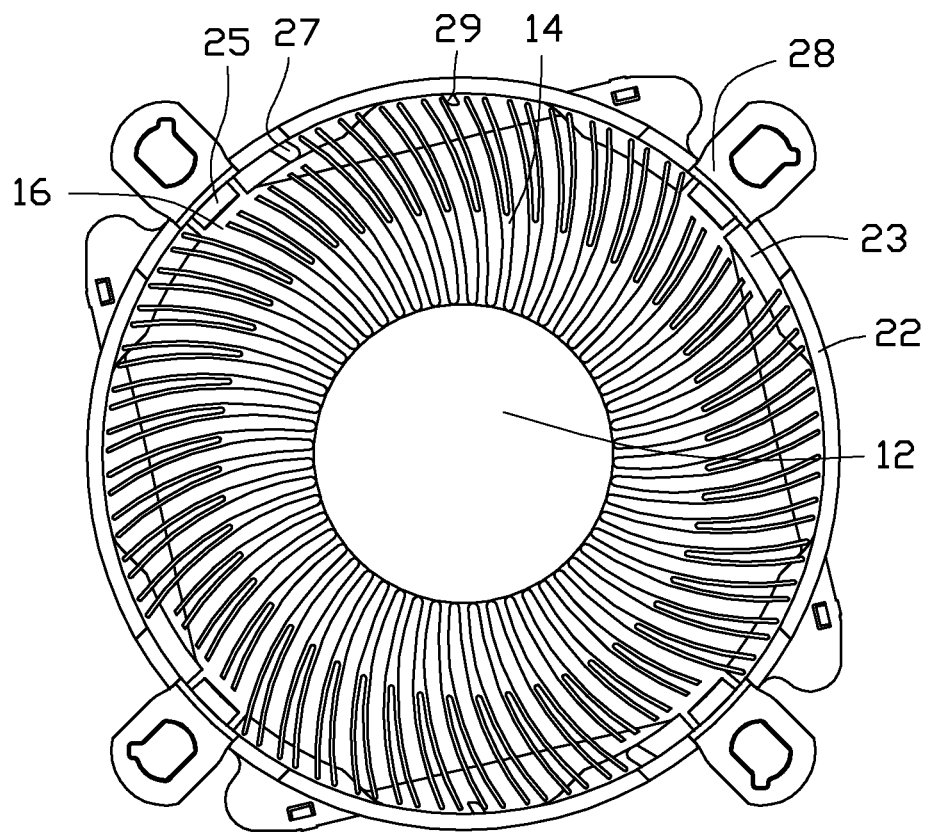
FIG. 5 is a bottom plan view of the assembly of the heat sink and the fixing frame in the unlocked position.

Referring to FIGS. 4-5, when the heat sink 10 and the fixing frame 20 are assembled, both the heat sink 10 and the fixing frame 20 are firstly placed upside-down, with the fins 14, 15 curved counterclockwise as viewed in FIG. 4. The heat sink 10 is put into the side plate 22, with a top of the heat sink 10 abutting the blocks 23 and the receiving depressions 16 of the heat sink 10 in alignment with the fixing legs 28, respectively. The protruding members 25 are located immediately above the receiving depressions 16, respectively, as viewed in FIG. 4. In this state, the heat sink 10 is rotatable with respect to the fixing frame 20, with the heat sink 10 and the fixing frame 20 being in an unlocked state. The first rib 29 is located between two neighboring first fins 14. The second rib 27 is received in one of the receiving depressions 16.

Figure 6:
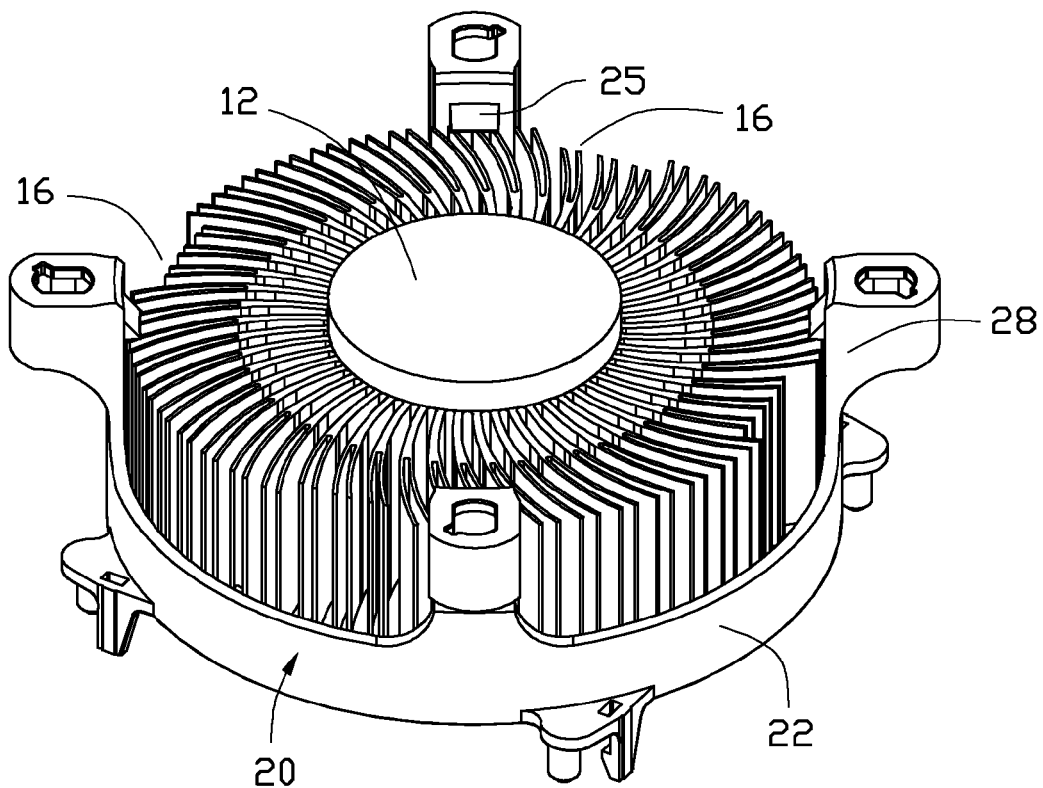
FIG. 6 is similar to FIG. 4, but shows the heat sink and the fixing frame in a locked position.
Figure 7:
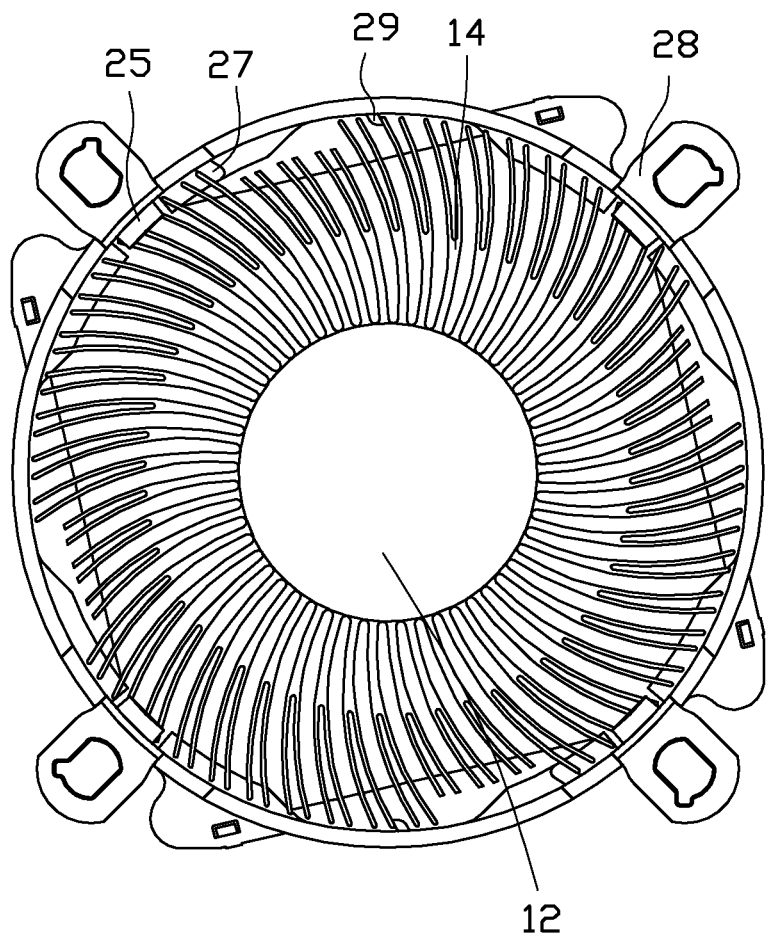
FIG. 7 is a bottom plan view of the assembly of the heat sink and the fixing frame in the locked position.

Referring also to FIGS. 6-7, the heat sink 10 is then rotated clockwise. During such rotation, outer ends of the branches 142 of certain of the first fins 14 ride over the first rib 29. By provision of the curved guide surface 292 of the first rib 29, only a small force is needed for the outer ends of the branches 142 of the first fins 14 to ride over the first rib 29. Therefore the heat sink 10 can be easily rotated in the fixing frame 20. The rotation is continued until the limitation surface 270 of the second rib 27 blocks a side surface of one of the first fins 14. In this position, the protruding members 25 of the fixing legs 28 abut tops of the branches 142 of certain of the first fins 14 of the heat sink 10, as viewed in FIGS. 6-7. The protruding members 25 and the blocks 23 cooperatively limit axial movement of the heat sink 10 relative to the fixing frame 20.

Thus, the heat sink 10 and the fixing frame 20 are in a locked state.

Referring to FIG. 7, when the heat sink 10 and the fixing frame 20 are locked, the limitation surface 270 of the second rib 27 prevents further clockwise rotation of the heat sink 10 as viewed in FIG. 7. Furthermore, the first rib 29 is located between two neighboring first fins 14, with the stopping surface 290 confronting an outer edge of one of the first fins 14 to prevent counterclockwise rotation of the heat sink 10 as viewed in FIG. 7. Thus, the limitation surface 270 of the second rib 27 and the stopping surface 290 of the first rib 29 cooperatively restrict rotation of the heat sink 10 relative to the fixing frame 20. As detailed above, when the heat sink 10 is rotated in the fixing frame 20 from the unlocked state to the locked state, only a small force is needed to rotate the heat sink 10. Thus, the heat sink 10 can be easily attached and locked to the fixing frame 20.

Referring back to FIG. 1, the fan 30 is mounted onto the heat sink 10, with a bottom surface of the bottom wall 34 contacting a top surface of the top plate 21. The mounting posts 260 of the fixing frame 20 are interferentially received in the through holes 340 of the bottom wall 34, respectively. The hooks 264 of the fastening arms 262 grasp a periphery the bottom wall 34 and abut a top surface of the bottom wall 34. Thus, the fan 30 is firmly secured to the combined heat sink 10 and fixing frame 20. Finally, a plurality of fasteners 100, such as bolts, are extended through the holes 280 of the fixing legs 28 of the fixing frame 20, to respectively engage the print circuit board 40. Thereby, the heat dissipation device is fixed to the electronic component 42.

It is to be understood, however, that even though numerous characteristics and advantages of various embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:
1. A heat dissipation device, comprising:
a round heat sink comprising a cylindrical core, and a plurality of sets of first fins and a plurality of sets of second fins extending outwardly from an outer surface of the cylindrical core, the plurality of sets of first fins and the plurality of sets of second fins being alternately arranged along a circumferential direction of the heat sink, each first fin being wider than each second fin as measured along a substantially radial direction of the heat sink, the heat sink defining a plurality of receiving depressions at an outer peripheral surface thereof, each of the receiving depressions being provided between two corresponding neighboring sets of first fins; and
a fixing frame comprising a peripheral side plate disposed around the heat sink and a plurality of fixing legs corresponding to the receiving depressions of the heat sink extending downwardly from the side plate, the side plate comprising a plurality of blocks extending inwardly from an inner surface thereof, a first rib and a second rib extending inwardly from the inner surface of the side plate, the first rib comprising a stopping surface at a lateral side thereof farthest away from the second rib and a curved guide surface at another lateral side thereof nearest to the second rib, the second rib comprising a limitation surface at a lateral side thereof farthest away from the first rib, a plurality of protruding members extending inwardly from the fixing legs;
wherein the heat sink is rotatably received in the fixing frame with a top of the heat sink abutting the blocks, and when the heat sink is in an unlocked state, the protruding members align with the receiving depressions, respec- tively, and when the heat sink is rotated to a locked state, the protruding members abut a bottom of the heat sink.

2. The heat dissipation device of claim 1, wherein when the heat sink is in the locked state, the blocks and the protruding members abut the top and bottom of the heat sink, respectively, to cooperatively limit axial movement of the heat sink relative to the fixing frame.

3. The heat dissipation device of claim 1, wherein the heat sink is substantially cylindrical in configuration.

4. The heat dissipation device of claim 1, wherein when the heat sink is in the unlocked state, the second rib is received in one of the receiving depressions, and the first rib is located between two neighboring first fins.

5. The heat dissipation device of claim 1, wherein when the heat sink is in the locked state, the limitation surface of the second rib locks a side surface of one of the first fins to prevent clockwise rotation of the heat sink and the stopping surface of the first rib confronts an outer edge of another one of the first fins to prevent counterclockwise rotation of the heat sink.

6. The heat dissipation device of claim 1, wherein when the heat sink is rotated in the fixing frame from the unlocked state to the locked state, an outer end of at least one of the first fins rides over the first rib.

7. The heat dissipation device of claim 1, wherein the first and second fins are all curved, and are all oriented along substantially the same direction relative to radial directions of the heat sink, a direction from the guide surface to the stopping surface of the first rib being opposite to the general direction of curvature of the first and second fins.

8. The heat dissipation device of claim 1, further comprising a fan mounted on the fixing frame, the fan defining a plurality of through holes at corners thereof, a plurality of ears corresponding to the corners of the fan extending outwardly from the side plate, and a plurality of mounting posts extending upwardly into the through holes of the fan, respectively.

9. The heat dissipation device of claim 8, wherein a plurality of fastening arms extends upwardly from the ears, each fastening arm comprising a hook at a top end thereof, the hook grasping a periphery of the fan.

10. A heat dissipation device, comprising:
a round heat sink comprising a plurality of fins and defining a plurality of receiving depressions at an outer peripheral surface thereof; and
a fixing frame defining a central axis and rotatably receiving the heat sink therein, the fixing frame comprising a plurality of protruding members extending inwardly from an inner surface thereof, a first rib and a second rib extending inwardly from the inner surface, the first rib comprising a stopping surface at a lateral side thereof farthest away from the second rib, the second rib comprising a limitation surface at a lateral side thereof farthest away from the first rib;
wherein when the heat sink is in an unlocked state in the fixing frame, the protruding members align with the receiving depressions of the heat sink, respectively, and when the heat sink is rotated in the fixing frame to a locked state, the protruding members abut a bottom of the heat sink and block movement of the heat sink along a direction of the central axis; and
wherein when the heat sink is in the locked state, the limitation surface of the second rib locks a side surface of one of the fins and the stopping surface of the first rib confronts an outer edge of another one of the fins to cooperatively prevent rotational movement of the heat sink.

11. The heat dissipation device of claim 10, wherein the heat sink comprises a cylindrical core, and the plurality of fins extend outwardly from an outer surface of the cylindrical core, and when the heat sink is in the unlocked state, the first rib is located between two neighboring fins and the second rib is received in one side of one of the receiving depressions, and when the heat sink is in the locked state, the first rib is located between another two neighboring fins, and the second rib is received in another side of the same receiving depression.

12. The heat dissipation device of claim 10, wherein the first rib further comprises a curved guide surface at another lateral side thereof adjacent to the second rib, and when the heat sink is rotated in the fixing frame from the unlocked state to the locked state, outer ends of certain of the fins ride over the first rib.

13. The heat dissipation device of claim 12, wherein the heat sink comprises a cylindrical core, the plurality of fins extend outwardly from the cylindrical core, and all of the fins are curved, and oriented along substantially the same direction relative to radial directions of the heat sink, a direction from the guide surface to the stopping surface of the first rib being opposite to the general direction of curvature of the fins.

14. A heat dissipation device, comprising:
a round heat sink comprising a plurality of fins and defining a plurality of receiving depressions at an outer peripheral surface thereof; and
a fixing frame defining a central axis and rotatably receiving the heat sink therein, the fixing frame comprising a plurality of protruding members extending inwardly from an inner surface thereof, a first rib and a second rib extending inwardly from the inner surface, the first rib comprising a stopping surface at a lateral side thereof farthest away from the second rib and a curved guide surface at another lateral side thereof adjacent to the second rib, the second rib comprising a limitation surface at a lateral side thereof farthest away from the first rib;
wherein when the heat sink is in an unlocked state in the fixing frame, the protruding members align with the receiving depressions of the heat sink, respectively; and
wherein when the heat sink is rotated in the fixing frame from the unlocked state to a locked state, outer ends of certain of the fins ride over the first rib, and the protruding members abut a bottom of the heat sink and block movement of the heat sink along a direction of the central axis.

15. The heat dissipation device of claim 14, wherein the heat sink further comprises a cylindrical core, the plurality of fins extend outwardly from the cylindrical core, and all of the fins are curved, and oriented along substantially the same direction relative to radial directions of the heat sink, a direction from the guide surface to the stopping surface of the first rib being opposite to the general direction of curvature of the fins.

* * * * *